United States Patent [19]
Holliday et al.

[11] Patent Number: 6,043,876
[45] Date of Patent: Mar. 28, 2000

[54] METHOD AND APPARATUS FOR DETECTING A SOLDER BRIDGE IN A BALL GRID ARRAY

[75] Inventors: Albert Holliday, Langhorne; Ralph E. Stenerson, Jr., Newtown, both of Pa.

[73] Assignee: Lucent Technologies, Inc., Murray Hill, N.J.

[21] Appl. No.: 09/168,638

[22] Filed: Oct. 8, 1998

[51] Int. Cl.⁷ ................................................. G01B 11/14
[52] U.S. Cl. .......................................................... 356/237.1
[58] Field of Search .......................... 356/237.1; 348/126; 29/833

[56] References Cited

U.S. PATENT DOCUMENTS

| | | | |
|---|---|---|---|
| 4,686,565 | 8/1987 | Ando | 358/106 |
| 4,686,637 | 8/1987 | Linker, Jr. et al. | |
| 4,704,700 | 11/1987 | Linker et al. | |
| 5,011,960 | 4/1991 | Ando et al. | |
| 5,194,948 | 3/1993 | L'Esperance et al. | 358/106 |
| 5,955,683 | 9/1999 | Holiday | |

FOREIGN PATENT DOCUMENTS 3-210410  9/1991  Japan.

OTHER PUBLICATIONS

Ersascope, Inspection System 3000, dated Jun. 1999.
Zweig, "'Voltage Blooming' of Real–Time X–ray Images", *Circuits Assembly*, Oct. 1998, pp 48–51.
Schlieper, "BGA Inspection and Rework Improve Yield", SMT, Mar. 1999, pp. 43–45.

*Primary Examiner*—Richard A. Rosenberger
*Attorney, Agent, or Firm*—Duane Morris & Heckscher LLP; Steven E. Koffs

[57] ABSTRACT

An apparatus is used to inspect an assembled circuit board having a device assembled to the circuit board by a ball grid array (BGA). The BGA includes a plurality of rows of solder connections. The apparatus has a source of light, which may be a laser. A first deflector is positioned to direct the light into a first side of the BGA, between two adjacent rows of solder connections in the BGA. A second deflector directs any light emitted from a second side of the BGA opposite the first side onto a target. The deflectors may be prisms, mirrors, or optical fibers. The target may be a viewing surface (such as a wall or screen) or a light detector, such as a camera, frame grabber, or photoelectric device. The absence of light on the target while the light is directed into the first side of the BGA indicates the presence of a solder bridge in the BGA. The light source, deflectors and detector may be moved at a constant rate along the length of the BGA, to provide a pattern of alternating light and dark illumination levels. The presence of a solder bridge may be detected based on the pattern.

18 Claims, 5 Drawing Sheets

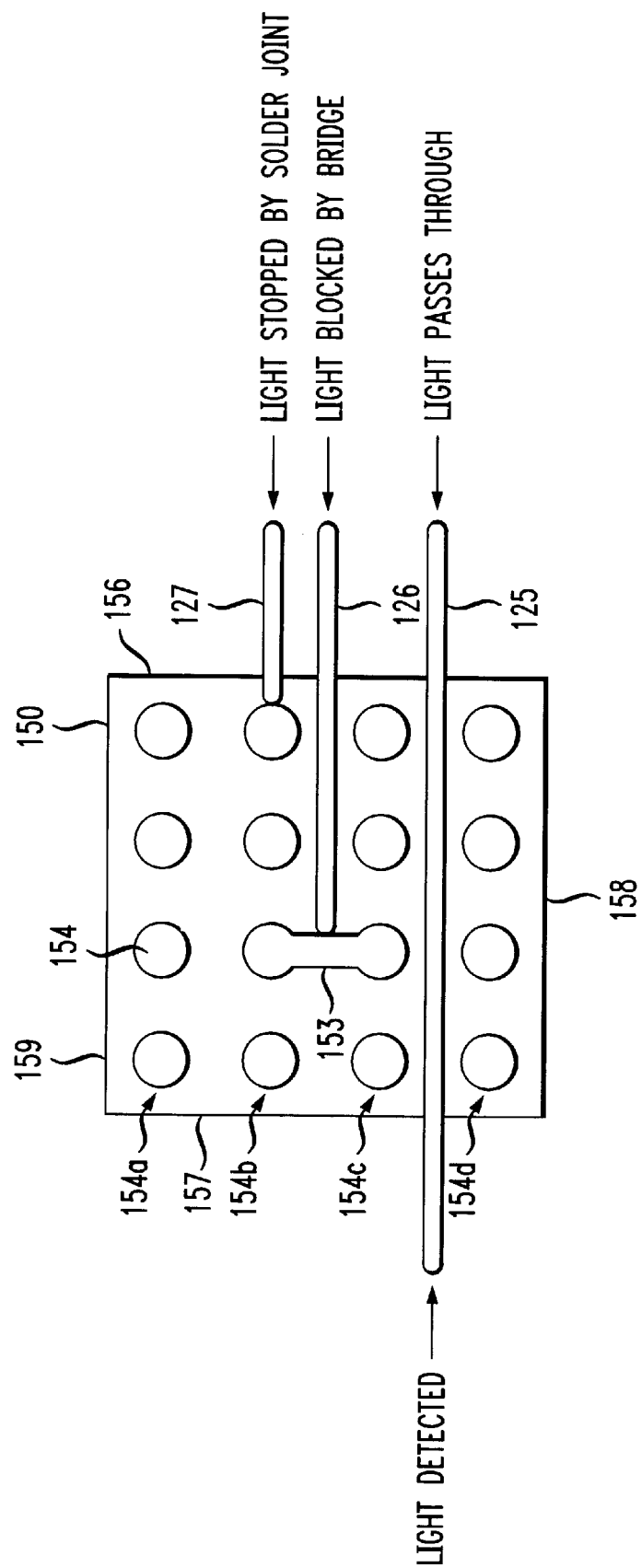

METHOD AND APPARATUS FOR DETECTING A SOLDER BRIDGE IN A BALL GRID ARRAY

FIELD OF THE INVENTION

The present invention relates to inspection methods generally, and more specifically to methods for inspecting ball grid array.

DESCRIPTION OF THE RELATED ART

The ball grid array (BGA) package is becoming an accepted alternative to conventional surface mount packages. Surface mount packages have a plurality of leads around the perimeter that are connected to respective pads on the printed circuit board (PCB).

BGA packages use the entire bottom surface area of the IC package for contacts, instead of just the perimeter. A rectangular array of evenly spaced contacts is positioned on the bottom surface of the package. A corresponding array of pads is formed on the PCB. A solder ball is formed on each respective contact on the IC package surface. The package is positioned so that the solder balls are aligned with the pads on the PCB. The assembly is heated to re-melt the solder balls and form the electrical connections between the IC package and the circuitry of the PCB.

Once assembled, the solder joints are hidden from view by the IC package. It is possible that a solder bridges may form between two adjacent solder balls during the remelting step; this solder bridge cannot be detected by visual inspection. In the prior art, X-ray inspection techniques are used to identify solder bridges under the BGA package after assembly. These X-ray systems can be costly (up to about $800,000.00) and cannot be installed in the assembly line because they are very slow. A faster, less expensive inspection system is desired.

SUMMARY OF THE INVENTION

The present invention is a method for inspecting an assembled circuit board having a device assembled to the circuit board by a BGA, by directing light between successive rows of solder connections, and detecting solder bridges when the directed light does not emerge from the opposite side of the BGA.

A light is directed into a first side of the BGA, between two adjacent rows of solder connections in the BGA. A determination is made whether the light is emitted from a second side of the BGA opposite the first side. A solder bridge is detected if the light is not emitted from the second side.

According to another aspect of the invention, a light from a light source is directed into a first side of the BGA. The light source is moved from a first end of the first side to a second end of the first side opposite the first end. A pattern of light is emitted from a second side of the light source opposite the first side, while the light source is being moved. A determination is made whether a solder bridge is present in the BGA based on the pattern.

According to another aspect of the invention, Apparatus is provided for inspecting an assembled circuit board having a device assembled to the circuit board by a BGA. The apparatus has a source of light. A first reflector is positioned to direct the light into a first side of the BGA, between two adjacent rows of solder connections in the BGA. A second reflector directs any light emitted from a second side of the BGA opposite the first side onto a target selected from the group consisting of a viewing surface and a light detector. The absence of light on the target while the light is directed into the first side indicates the presence of a solder bridge in the BGA.

These and other aspects of the invention are described below with reference to the exemplary embodiments.

BRIEF DESCRIPTION OF THE DRAWINGS

FIG. 1C is a plan view showing how light is blocked by solder balls and solder bridges during inspection using the apparatus of FIG. 1A.

DETAILED DESCRIPTION

Figure 1A:
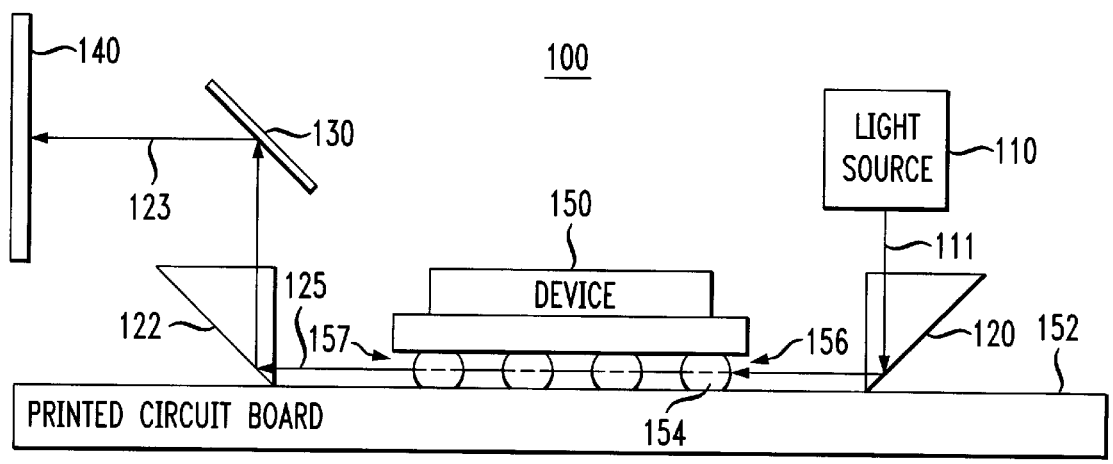
FIG. 1A is a block diagram showing an exemplary apparatus according to the present invention.
Figure 1B:
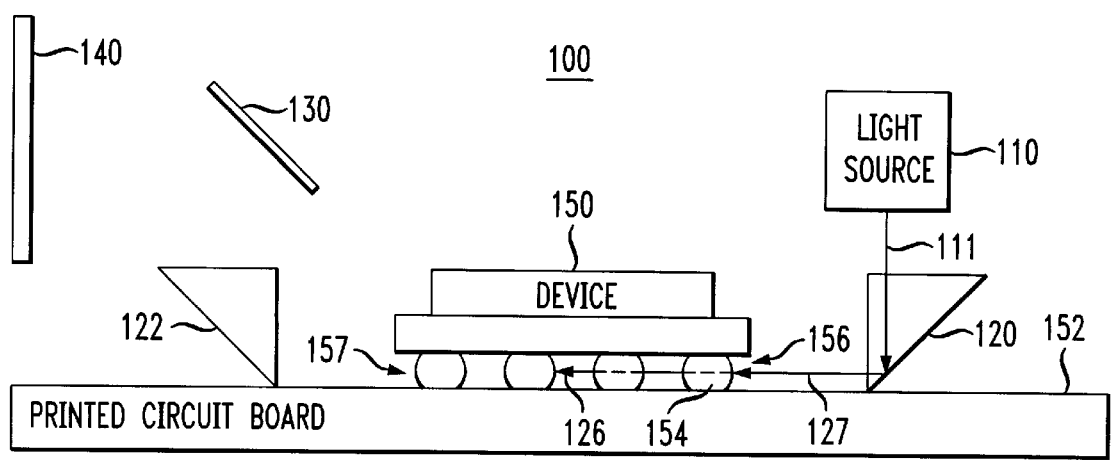
FIG. 1B is a block diagram showing the apparatus of FIG. 1, with a solder bridge blocking the light from the light source.

FIGS. 1A–1C show a first exemplary embodiment of the invention. The invention is a method and apparatus for inspecting an assembled circuit board 152 having a device 150 assembled to the circuit board 152 by a BGA 154. The BGA 154 includes a plurality of rows 154a–154d of solder connections.

The method includes directing a light 111 into a first side 156 of the BGA 154, between two adjacent rows (e.g., 154b and 154c) of solder connections in the BGA 154. A determination is made whether the light is emitted from a second side 157 of the BGA opposite the first side 156 (as shown by light ray 125). A solder bridge 153 is detected if the light is not emitted from the second side 157 (shown by light ray 126 in FIG. 1C).

As shown in FIGS. 1A and 1B, an apparatus 100 for performing the inspection includes a means for generating light, which may be source 110 of light 111. Preferably, the light is collimated. The light source 110 may be, for example, a laser. The inventors have achieved satisfactory results using a conventional Helium-Neon laser "pointer" device. It is also possible to use a non-collimated light source.

Means are provided for directing the light into a first side of the BGA, between two adjacent rows of solder connections in the BGA. For example, a first reflector 120 may be positioned so as to direct the light 111 into a first side 156 of the BGA 154, between two adjacent rows (e.g., 154b and 154c) of solder connections in the BGA 154.

Means are provided for detecting or displaying light, and for directing any light emitted from a second side of the BGA opposite the first side onto the means for detecting or displaying light, so that absence of light on the means for detecting or displaying light while the light is directed into the first side indicates the presence of a solder bridge in the BGA. For example, a second reflector 122 may be provided for directing any light 125 emitted from a second side 157 of the BGA 154 opposite the first side 156, onto a target 140. Additional intermediate reflectors such as mirror 130 may be provided, depending on the location of the target, to direct the light to the target 140.

The first and second reflectors 120 and 122 may be, for example, mirrors or prisms. The target 140 may be, for example a viewing surface (such as a wall or a screen) or a light detector (e.g., a camera, frame grabber, or photoelectric device).

Absence of light 123 on the target 140 while the light 111 is directed into the first side 156 indicates the presence of a solder bridge 153 in the BGA 154. If the light 123 is observed when examining a space between two rows (e.g., rows 154c and 154d), then a solder bridge has not been detected, and the inspection is continued by directing the light between the next two rows (e.g., 154b and 154c).

If light 123 is emitted when each of the spaces between each successive pair of rows in the BGA 154 is inspected, then no bridge has been detected extending in a direction perpendicular to sides 156 and 157. Either the PCB 152 or the apparatus for inspection is rotated 90 degrees, and the light is then directed into the third side 158 (FIG. 1C). As described above, if no light is emitted from the fourth side 159 (FIG. 1C) when the light is directed between two adjacent columns of the BGA 154, then a solder bridge is detected. If light is emitted from the fourth side 159, then no bridge is detected.

As shown in FIGS. 1A and 1B, for ease of viewing, a deflector 130 may be positioned at the second side of the BGA 154 so as to project any light 123 emitted from the second side onto a surface 140. By viewing the surface, the user can determine that light 125 is being emitted from the second side 157 if the surface 140 is illuminated.

One of ordinary skill in the art recognizes that non-collimated light may be used. A detector (not shown in FIGS. 1A and 1B) could be positioned to detect only in the area of a specific space between a specific pair of rows being inspected at any given time.

Figure 2:
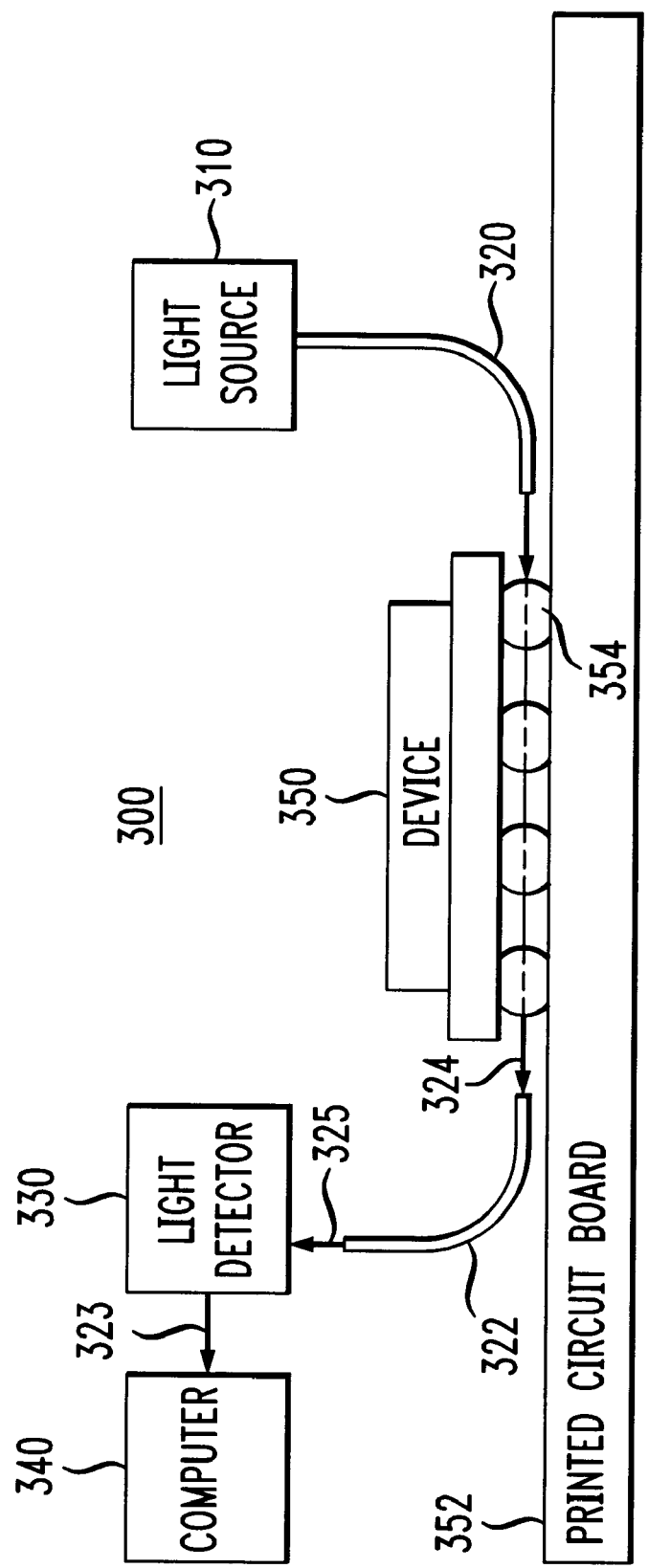
FIG. 2 is a block diagram showing a side elevation view of third exemplary apparatus according to the invention.

FIG. 2 shows a second exemplary method and apparatus 300 according to the invention. Apparatus 300 includes light generating means, light directing means and light detecting or displaying means. In FIG. 2, however, the light directing means includes optical fibers 320 and 322.

In system 300, a light source 310, provides light which is preferably collimated. An optical fiber 320 directs the light into the first side of the BGA, between a pair of consecutive rows of solder connections. As a second side of the BGA 354 opposite the first side, a second optical fiber 322 directs any light emitted from the second side of the BGA onto a target. As in the case of the embodiment of FIGS. 1A–1C, the target may be either a surface or a detector. FIG. 2 shows a light detector 330, which is advantageous in combination with the optical fiber, as such detectors are inexpensive and are readily commercially available. The light detector 330 may be connected to a computer 340, to provide signals 323 indicating whether light 324 is emitted from the BGA and transmitted to light detector 330 by the second optical fiber 322. The computer 340 can thus determine whether a solder bridge is detected based on whether light 324 is emitted from the second side of the BGA. A solder bridge is detected if light is not emitted from the second side.

Multiple optical fibers 320, 322 may be used in a linear array (not shown), with about 1.27 millimeters (50 mils) between fibers (the exact spacing corresponding to the pitch between rows of solder connections in the BGA 154. A ganged detector (not shown) can simultaneously collect light from the fibers 322.

Figure 3A:
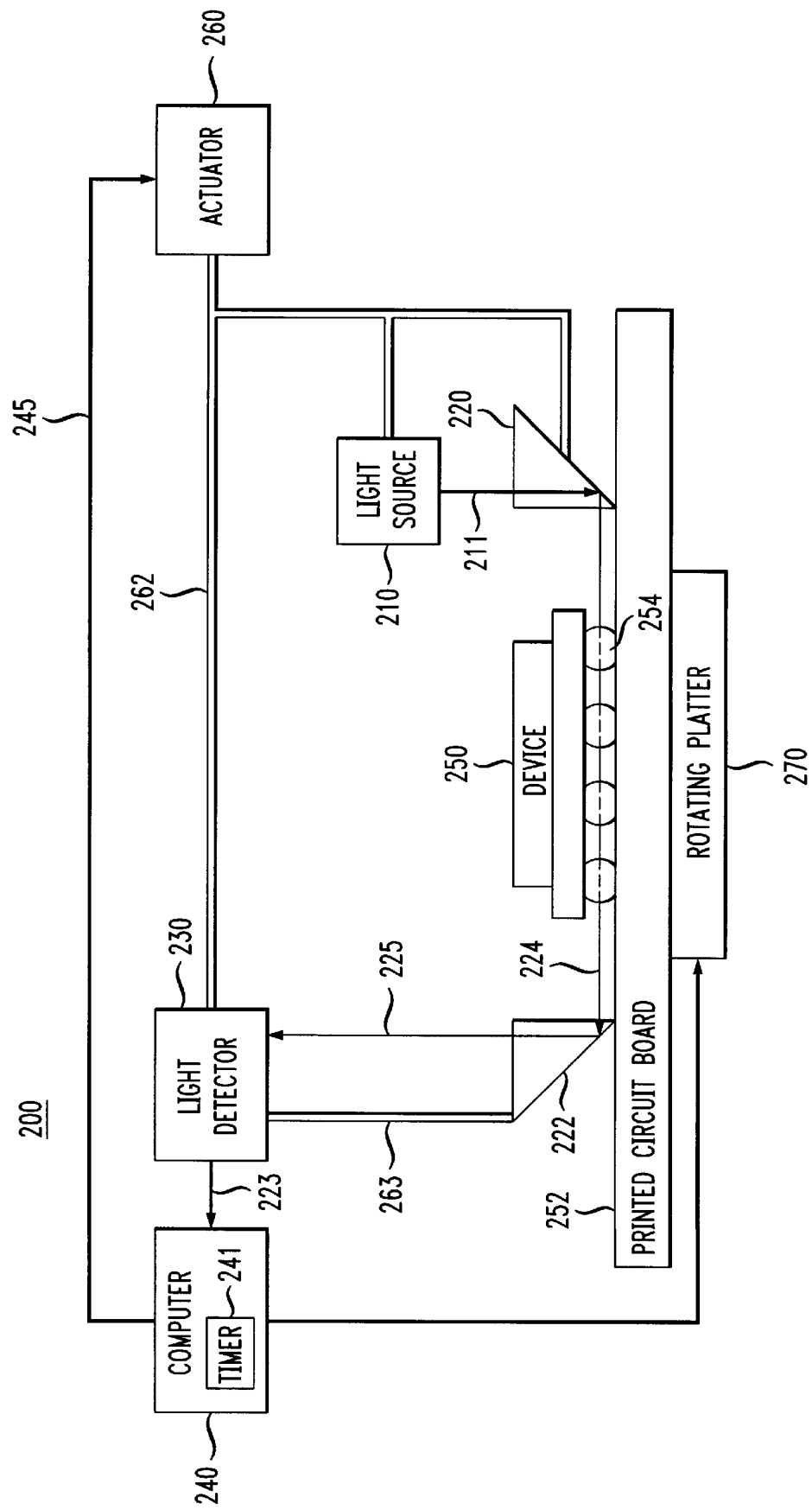
FIG. 3A is a block diagram showing a side elevation view of second exemplary apparatus according to the invention.
Figure 3B:
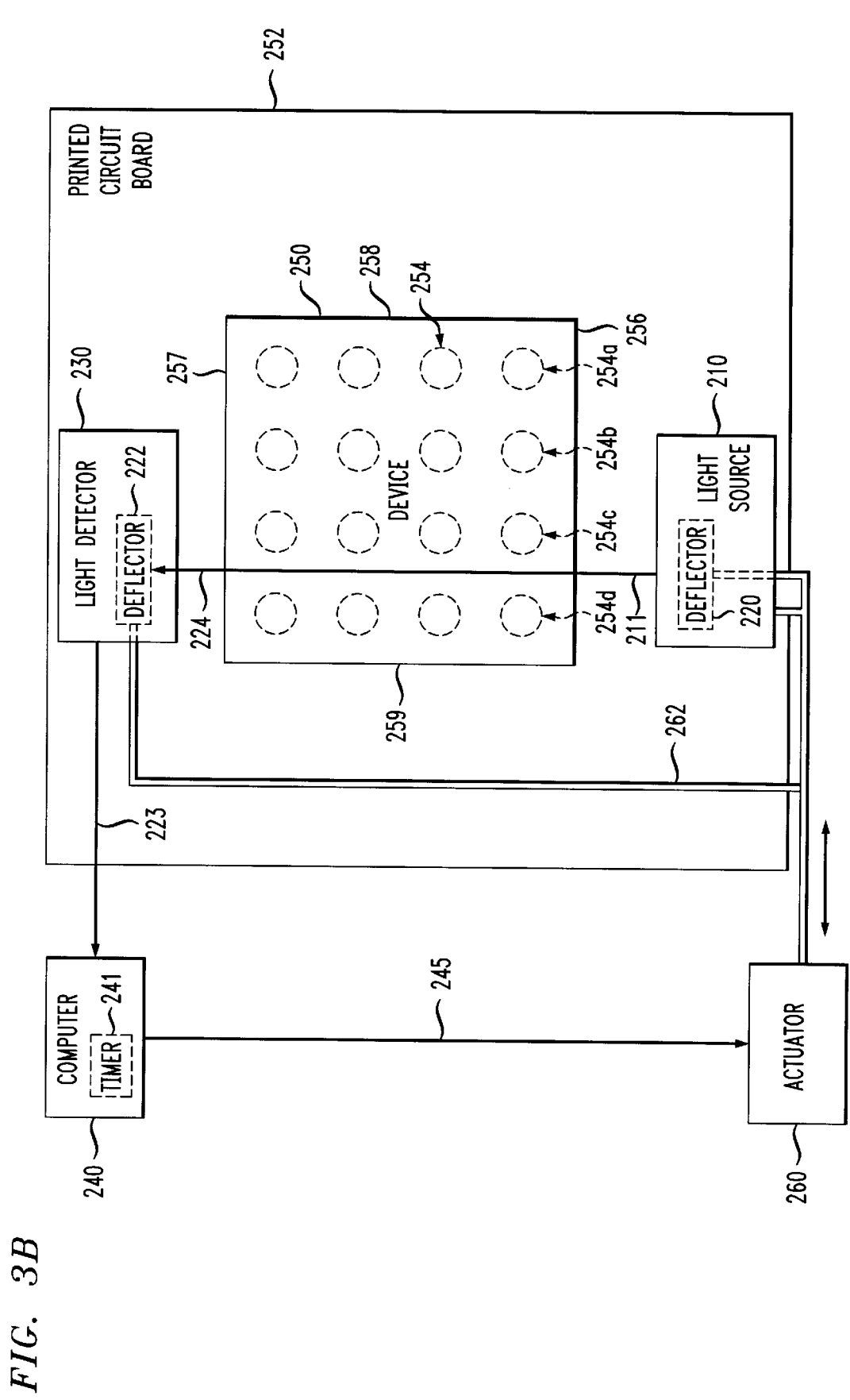
FIG. 3B is a block diagram showing a plan view of top plan view of the second exemplary apparatus of FIG. 3A.

FIGS. 3A and 3B show a third exemplary embodiment of the invention. As with the first and second examples, the embodiment of FIG. 3 is an apparatus 200 for detecting a solder bridge between two adjacent rows of solder connections in a BGA if a beam of light directed between those two adjacent rows does not emerge from the other side of the BGA. As with the first and second embodiments, apparatus 200 includes light generating means, light directing means, and light detecting or displaying means. FIGS. 3A and 3B provide an example of an apparatus that may be used to automate the inspection process.

The embodiment of FIG. 3 takes advantage of a common design practice for BGAs; it is common for the pitch between adjacent rows and columns of the BGA to be set to a constant minimum value, so as to minimize the area of the device (or maximize the number of solder connections on the face of a device having any given area). Because the pitch is constant, a light beam moving between rows at a constant linear rate has a constant period between consecutive rows, and a constant period of blockage by each row.

Thus, if the pattern of light emerging from the second side of the BGA is plotted as a function of time, for a device that is free of any solder bridges, assuming substantially constant solder ball diameter, a repetitive wave pattern results, having a substantially constant (light) pulse width T1, and a substantially constant period T2 between leading edges of consecutive pulses. The time of darkness between pulses is T3. If the velocity of movement of the light along the side of the device 250 is V, the pitch is P, and the average diameter of the solder balls (after they are remelted to their final shape) is D, the relationships are as follows:

$$T1=(P-D)/V \qquad (1)$$

$$T2=P/V \qquad (2)$$

$$T3=D/V \qquad (3)$$

In the presence of a solder bridge, at least one pulse of light is missing from the pattern. Instead, an extended time of darkness of length T1+2*T3 (=T2+T3) is detected.

As shown in FIGS. 3A and 3B, the apparatus may be provided with means for actuating the light generating means along a length of the first side of the BGA; means for measuring durations of alternating periods of light and darkness while the light generating means is actuated along the length of the first side of the BGA; and processing means for determining whether a solder bridge is present based on the measured durations.

To move the light source 210 at a constant linear velocity V, a simple linear actuator 260 may be used. The movement of linear actuator 260 may be controlled by a processor, microprocessor, micro controller or computer 240. The processor 240 tracks the movement of the light source 210, and the timing of the light detected by the detector 230. If a general purpose computer is used, then the computers clock may be used to provide the system timer 241. Alternatively, a separate timer (not shown) may be used.

According to the method and apparatus of FIGS. 3A and 3B, a light 211 is directed from a light source 210 into a first side 256 of the BGA 254. The light source 210 is moved from a first end of the first side to a second end of the first side opposite the first end. A pattern of light 224 emitted from a second side 257 of the BGA 254 (the second side 257 being opposite the first side 256) is detected while the light source 210 is being moved. The system 200 determines whether a solder bridge is present in the BGA 254 based on the pattern. If the pattern includes continuous and regular alternating lengths of light T1 and darkness T3, then no bridge is detected. If there is an extended length of darkness (substantially longer than T3), then a solder bridge is detected.

One of ordinary skill in the art recognizes that the fixtures 262 and 263 shown for connecting the linear actuator 260, the light source 210, the deflectors 220 and 222 and the light detector 230 are functional representations. The size and shape of the fixtures depend on the size and shape of the test apparatus. The function of fixtures 262 and 263 (if a linear actuator is used) is for providing the same linear translation to the light source 210, deflectors 220 and 222, and detector 230.

As shown in FIG. 3A, the PCB 252 may be placed on a rotating platter, to rotate the PCB by 90 degrees after all of the spaces between consecutive pairs of rows 254a–254d of solder connections are inspected. Then, the inspection process may be repeated for all of the columns of solder connections, by directing the light into a third side 258 of the BGA 254, and determining whether a regular uninterrupted (square wave) pattern of light emerges from the fourth side 259 of the BGA 254.

Many variants of the exemplary embodiments are contemplated withing the scope of the invention. Although the example of FIGS. 3A and 3B show prisms 220 and 222, one of ordinary skill recognizes that other means for directing light between the rows of solder connections (such as, for example, optical fibers, lenses or mirrors) may be used. Similarly, the light detector 230 may be any light detector including, but not limited to, a camera, frame grabber, transducer, video camera, or the like.

One of ordinary skill in the art further recognizes that the light detector 230 may measure the amplitude of the received light, and be capable of distinguishing intermediate levels of light between the "light" and "dark" values. If a solder bridge has a hole or gap of sufficient size to allow light to pass therethrough (while still providing an electrical path between two adjacent solder connections), an intermediate light level may be detected. Thus, the processor 240 may be programmed to treat an intermediate light level the same way as a totally dark level. Alternatively, the processor 240 may be programmed to distinguish intermediate light levels from totally dark levels, for use in troubleshooting.

Although the example of FIGS. 3A and 3B shows a linear actuator 260 for moving the light source 210 at a constant linear rate, one of ordinary skill in the art recognizes that the light source may be maintained at a fixed linear position, while rotating the light source (not shown) to direct the light towards successive spaces between consecutive pairs of solder connections. Mirrors or other deflectors positioned near the device 250 can direct the light in a straight path between the rows. Similar deflectors on the second side of the device 250 could direct the light to a detector that is maintained in a fixed position, while rotating the detector towards the deflector for each successive space being inspected.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A method for inspecting an assembled circuit board having a device assembled to the circuit board by a ball grid array, the ball grid array including a plurality of rows of solder connections, the method comprising the steps of:
   (a) directing a light into a first side of the ball grid array, between two adjacent rows of solder connections in the ball grid array;
   (b) determining whether any of the light is transmitted between the two adjacent rows and emitted from a second side of the ball grid array opposite the first side; and
   (c) detecting a solder bridge if the light is not emitted from the second side.

2. A method according to claim 1, wherein step (a) includes deflecting the light between the device and the circuit board using one of the group consisting of a mirror and a prism.

3. A method according to claim 1, wherein step (a) includes deflecting the light between the device and the circuit board with an optical fiber.

4. A method according to claim 1, wherein step (b) includes:
   (b)(1) positioning a deflector at the second side of the ball grid array so as to project any light emitted from the second side onto a surface; and
   (b)(2) viewing the surface; and
   (b)(3) determining that light is emitted from the second side if the surface is illuminated.

5. A method for inspecting an assembled circuit board having a device assembled to the circuit board by a ball grid array, the method comprising the steps of:
   (a) directing a light from a light source into a first side of the ball grid array;
   (b) moving the light from a first end of the first side to a second end of the first side opposite the first end;
   (c) detecting a pattern of light emitted from a second side of the light source opposite the first side, while the light source is being moved; and
   (c) determining whether a solder bridge is present in the ball grid array based on the pattern.

6. A method according to claim 5, wherein,
   the pattern comprises alternating periods of light and darkness, and
   in the absence of a solder bridge, the periods of darkness are approximately equal to a predetermined duration.

7. A method according to claim 6, wherein, if a solder bridge is present, at least one period of darkness is substantially longer than the predetermined duration.

8. A method according to claim 5, wherein step (b) includes:
   (b)(1) positioning a deflector at the second side of the ball grid array so as to project any light emitted from the second side onto a surface; and
   (b)(2) viewing the surface; and
   (b)(3) determining that light is emitted from the second side when the surface is illuminated.

9. Apparatus for inspecting an assembled circuit board having a device assembled to the circuit board by a ball grid array, the ball grid array including a plurality of rows of solder connections, the apparatus comprising:
   a source of light;
   a first reflector positioned to direct the light into a first side of the ball grid array, between two adjacent rows of solder connections in the ball grid array;
   a second reflector for directing any light emitted from a second side of the ball grid array opposite the first side onto a light detector, the first and second reflectors extending along respective lengths of the first and second sides of the ball grid array;
   a linear actuator for moving the light source along the first side of the ball grid array at a controlled rate; and
   a timer for measuring alternating periods of light and darkness at the light detector while the light source is moved along the first side of the ball grid array.

10. Apparatus according to claim 9, wherein the first and second reflectors are mirrors.

11. Apparatus according to claim 9, wherein the first and second reflectors are prisms.

12. Apparatus according to claim 9, wherein the light source is a laser.

13. Apparatus according to claim 9, wherein the light detector is selected from the group consisting of a camera, a frame grabber, and a photoelectric device.

14. Apparatus according to claim 9, wherein comprising a processor coupled to the timer, for determining that a solder bridge is present, if at least one period of darkness is substantially longer than the predetermined duration.

15. Apparatus for inspecting an assembled circuit board having a device assembled to the circuit board by a ball grid array, the ball grid array including a plurality of rows of solder connections, the apparatus comprising:

means for generating a light;

means for directing the light into a first side of the ball grid array, between two adjacent rows of solder connections in the ball grid array;

means for detecting or displaying light; and means for directing any of the light transmitted between the two adjacent rows and emitted from a second side of the ball grid array opposite the first side onto the means for detecting or displaying light, so that absence of light on the means for detecting or displaying light while the light is directed into the first side indicates the presence of a solder bridge in the ball grid array.

16. Apparatus according to claim 15, further comprising means for actuating the light generating means along a length of the first side of the ball grid array.

17. Apparatus according to claim 16, further comprising means for measuring durations of alternating periods of light and darkness while the light generating means is actuated along the length of the first side of the ball grid array.

18. Apparatus according to claim 17, further comprising processing means for determining whether a solder bridge is present based on the measured durations.

* * * * *